(12) United States Patent
Jacobson

(10) Patent No.: US 9,024,233 B2
(45) Date of Patent: May 5, 2015

(54) SIDE EDGE CLEANING METHODS AND APPARATUS FOR THIN FILM PHOTOVOLTAIC DEVICES

(75) Inventor: Luke W. Jacobson, Arvada, CO (US)

(73) Assignee: First Solar, Inc., Tempe, AZ (US)

( * ) Notice: Subject to any disclaimer, the term of this patent is extended or adjusted under 35 U.S.C. 154(b) by 759 days.

(21) Appl. No.: 13/308,260

(22) Filed: Nov. 30, 2011

(65) Prior Publication Data

US 2013/0133689 A1 May 30, 2013

(51) Int. Cl.
| | |
|---|---|
| *B08B 7/00* | (2006.01) |
| *B23K 26/08* | (2014.01) |
| *B23K 26/082* | (2014.01) |
| *B23K 26/362* | (2014.01) |
| *B23K 26/06* | (2014.01) |

(52) U.S. Cl.
CPC ............ *B08B 7/0042* (2013.01); *B23K 26/083* (2013.01); *B23K 26/0621* (2013.01)

(58) Field of Classification Search
CPC ............ B08B 7/0042; B23K 26/0621; B23K 26/0846; B23K 26/0838; B23K 26/083
USPC ............... 219/121.76, 121.77, 121.82; 134/1
See application file for complete search history.

(56) References Cited

U.S. PATENT DOCUMENTS

| | | | | |
|---|---|---|---|---|
| 4,645,900 | A * | 2/1987 | Heyden | 219/121.67 |
| 4,886,728 | A | 12/1989 | Salamy et al. | |
| 5,151,135 | A * | 9/1992 | Magee et al. | 134/1 |
| 5,780,806 | A * | 7/1998 | Ferguson et al. | 219/121.68 |
| 5,814,433 | A | 9/1998 | Nelson et al. | |
| 6,576,870 | B2 * | 6/2003 | Wu | 219/121.72 |
| 6,845,635 | B2 * | 1/2005 | Watanabe et al. | 219/121.76 |
| 2002/0125257 | A1 * | 9/2002 | Ronge et al. | 134/1 |
| 2004/0134893 | A1 * | 7/2004 | Duquette | 219/121.67 |
| 2008/0277061 | A1 * | 11/2008 | Kobayashi et al. | 156/345.5 |
| 2011/0095004 | A1 | 4/2011 | Catalano et al. | |
| 2011/0168672 | A1 * | 7/2011 | Harte et al. | 216/65 |
| 2011/0290276 | A1 * | 12/2011 | Cha et al. | 134/1 |
| 2013/0087534 | A1 * | 4/2013 | Denney | 219/121.14 |

FOREIGN PATENT DOCUMENTS

JP          55119183 A   *  9/1980

OTHER PUBLICATIONS

Joe Hunter, U.S. Appl. No. 13/308,288, filed Nov. 30, 2011, Side Edge Cleaning Methods and Apparatus for Thin Film Photovoltaic Devices.

* cited by examiner

*Primary Examiner* — Geoffrey S Evans
(74) *Attorney, Agent, or Firm* — MacMillan, Sobanski & Todd, LLC

(57) ABSTRACT

Methods for cleaning a side edge of a thin film photovoltaic substrate utilizing a laser are provided. The method can include transporting the substrate in a machine direction to move the substrate past a first laser source, and focusing a first laser beam generated by the first laser source onto the side edge of the substrate such that the laser beam removes the thin film present on the side edge of the substrate. An apparatus is also generally provided for cleaning a first side edge and a second side edge of a thin film photovoltaic substrate.

20 Claims, 2 Drawing Sheets

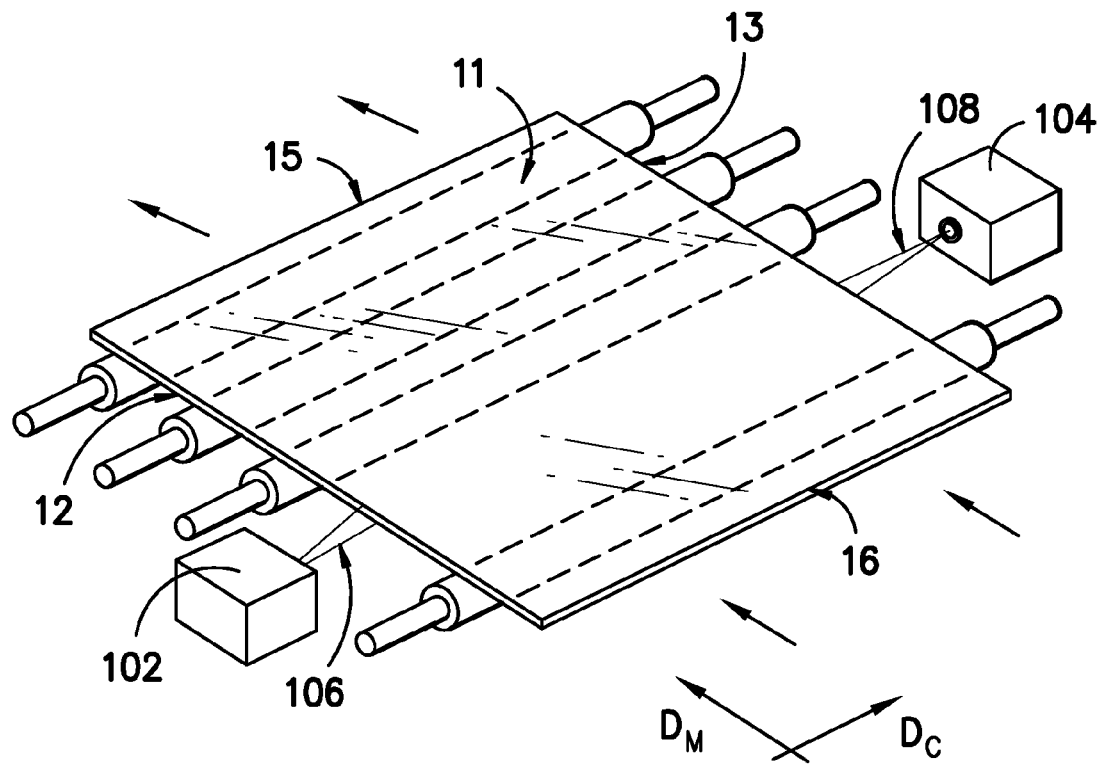
FIG. -1-
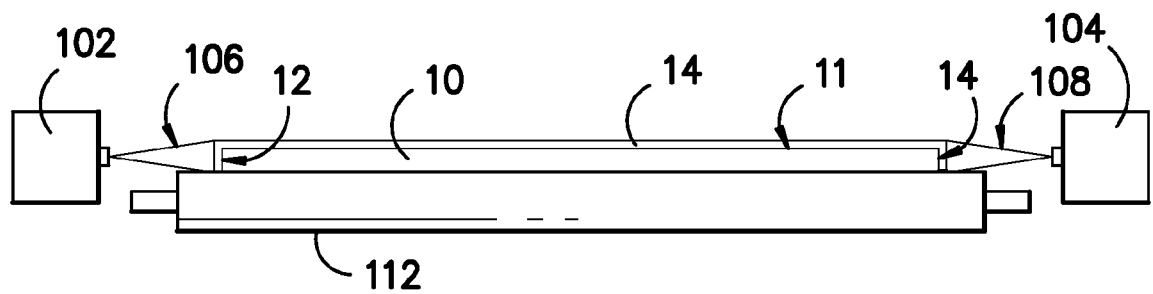
FIG. -2-

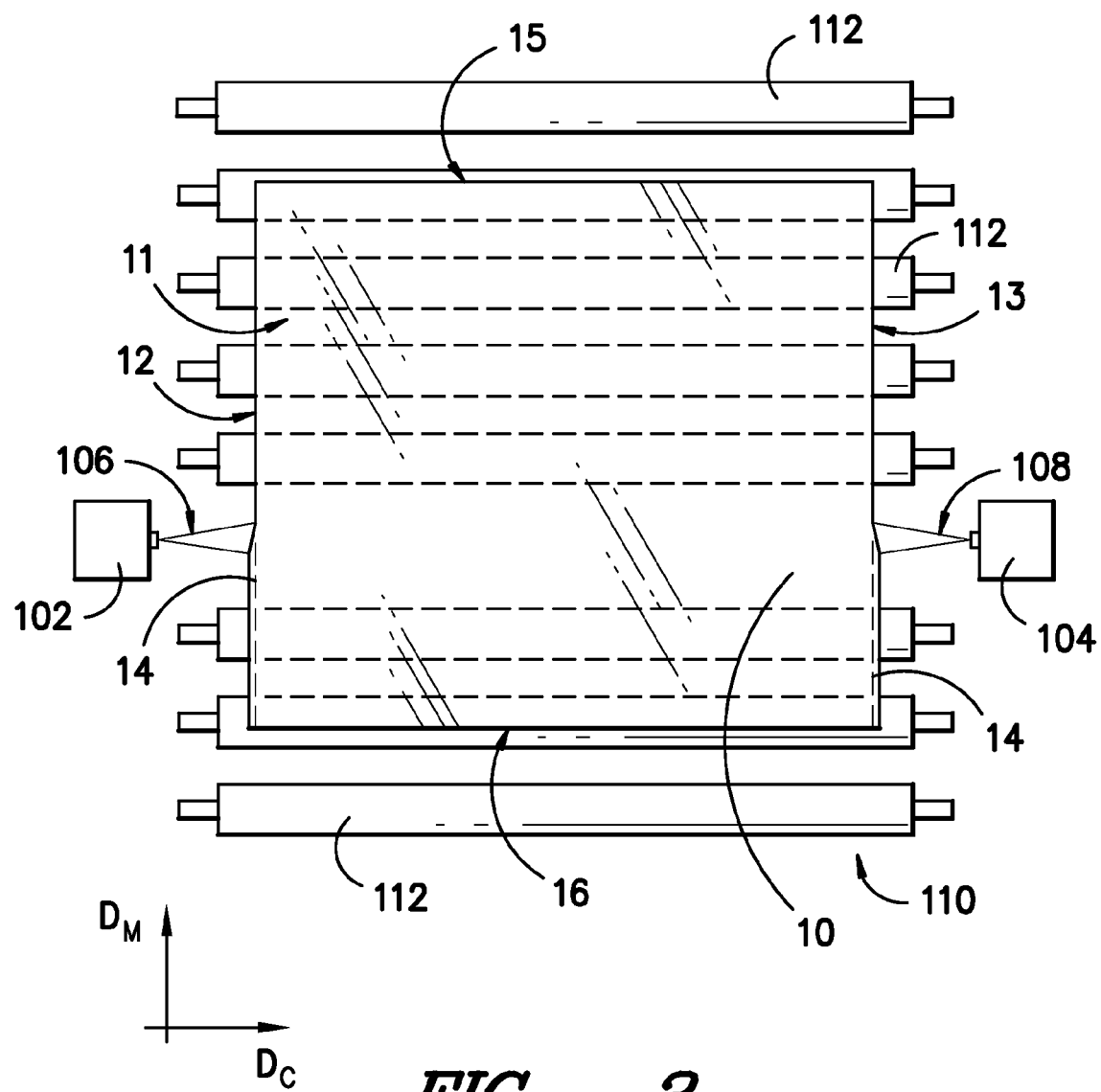
FIG. -3-

SIDE EDGE CLEANING METHODS AND APPARATUS FOR THIN FILM PHOTOVOLTAIC DEVICES

FIELD OF THE INVENTION

The subject matter disclosed herein relates generally to cleaning the side edges of a thin film photovoltaic device. More particularly, the subject matter disclosed herein relates to methods and apparatus for removing materials deposited on the side edge of thin film photovoltaic device prior to finishing the device.

BACKGROUND OF THE INVENTION

During deposition of a thin film on a substrate in the formation of a thin film photovoltaic device, the thin film material tends to deposit on unwanted areas of the substrate. This unwanted deposition can be particularly present when a vapor deposition process (e.g., a closed space sublimation process) is utilized to form the thin film layer on the substrate. The thin film material can deposit and/or adhere to the side edges of the substrate (i.e., along the perimeter of the substrate) as well as on the face of the substrate. For example, when depositing cadmium telluride onto a photovoltaic substrate to form a photovoltaic absorber layer of a thin film photovoltaic device, cadmium telluride can also deposit onto the side edges of the substrate.

This unwanted deposition of thin film material on the substrate should be removed prior to completion of the device. For example, such thin film materials present on the side edges of the substrate, which are sometimes referred to as the "pencil edge" of a given panel, should be removed prior to sealing of the photovoltaic device. Additionally, the thin film materials on the side edge should be removed to prevent it from exposure or release to the environment once the device is placed into service. For example, when dealing with cadmium telluride, it is desired that all of the cadmium telluride material be encased within the photovoltaic device to prevent release of cadmium into the environment. However, removal of the unwanted thin film material deposited on the side edge can be a delicate process, since the removal process should not otherwise alter or affect the thin film layer(s) on the face of the substrate.

Thus, a need exists for apparatus and methods for cleaning a side edge of a thin film photovoltaic device. In particular, a need exists for apparatus and methods for removing thin film materials from a side edge of a thin film photovoltaic substrate.

BRIEF DESCRIPTION OF THE INVENTION

Aspects and advantages of the invention will be set forth in part in the following description, or may be obvious from the description, or may be learned through practice of the invention.

Methods are generally provided for cleaning a side edge of a thin film photovoltaic substrate utilizing a laser. In one embodiment, the method can include transporting the substrate in a machine direction to move the substrate past a first laser source, and focusing a first laser beam generated by the first laser source onto the side edge of the substrate such that the laser beam removes the thin film present on the side edge of the substrate.

An apparatus is also generally provided for cleaning a first side edge and a second side edge of a thin film photovoltaic substrate. In one embodiment, the apparatus can include a first laser source configured to focus a first laser beam; a second laser source configured to focus a second laser beam; and, a transport mechanism configured to move the substrate in a machine direction past the first laser source and the second laser source such that the first side edge of the substrate directly faces the first laser source and the second side edge of the substrate directly faces the second laser source.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which:

FIG. 1 shows a general schematic of one embodiment of an exemplary apparatus for removing material from side edges of a thin film photovoltaic device;

FIG. 2 shows a general schematic of a cross-sectional view of the apparatus of FIG. 1; and, FIG. 3 shows a general schematic of a top view of the apparatus of FIG. 1.

Repeat use of reference characters in the present specification and drawings is intended to represent the same or analogous features or elements.

DETAILED DESCRIPTION OF THE INVENTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

In the present disclosure, when a layer is being described as "on" or "over" another layer or substrate, it is to be understood that the layers can either be directly contacting each other or have another layer or feature between the layers, unless otherwise stated. Thus, these terms are simply describing the relative position of the layers to each other and do not necessarily mean "on top of" since the relative position above or below depends upon the orientation of the device to the viewer. Additionally, although the invention is not limited to any particular film thickness, the term "thin" describing any film layers of the photovoltaic device generally refers to the film layer having a thickness less than about 10 micrometers ("microns" or "µm").

It is to be understood that the ranges and limits mentioned herein include all ranges located within the prescribed limits (i.e., subranges). For instance, a range from about 100 to about 200 also includes ranges from 110 to 150, 170 to 190, 153 to 162, and 145.3 to 149.6. Further, a limit of up to about 7 also includes a limit of up to about 5, up to 3, and up to about 4.5, as well as ranges within the limit, such as from about 1 to about 5, and from about 3.2 to about 6.5.

Methods and apparatus are generally provided for cleaning a side edge of a photovoltaic substrate. More particularly, the methods and apparatus described herein can remove thin film materials from the side edge of the substrate without substantially affecting the thin film layer on a face surface of the substrate, with the side edge being, e.g., generally orthogonal to the face surface. As such, any unwanted, extra thin film material deposited onto the side edge(s) of the substrate can be removed during processing of the thin film photovoltaic device, while maintaining the functionality of the thin film layers on the face surface of the substrate.

In one embodiment, the method can include transporting the substrate in a machine direction to move the substrate past a first laser source, and focusing a first laser beam onto the side edge of the substrate such that the laser beam removes the thin film present on the side edge of the substrate. The substrate generally comprises a face surface, a deposition surface, and a side edge interposed therebetween. For example, the side edge can be generally orthogonal to the face surface, or may be beveled at an angle other than 90°. In one particular embodiment, the thin film layer on the face surface of the substrate can be substantially unaffected by the first laser beam focused onto the first side edge of the substrate. For example, the laser beam can be focused directly onto the side edge of the substrate such that the laser beam does not substantially interact with a thin film layer on the facing surface of the substrate. It is noted that the focus plane does not necessarily need to be the exact surface of the side edge, and will work if our focus plane is just prior to, or just after, the surface of the side edge. As such, the term "focus" means directing the laser beam directly onto the side edge.

Referring to FIGS. 1-3, an exemplary apparatus 100 is shown for cleaning a first side edge 12 and a second side edge 13 of a thin film photovoltaic substrate 10. The substrate 10 generally has a facing surface 11 with a thin film layer(s) 14 present thereon. As shown, the facing surface 11 terminates at the first side edge 12 and the second side edge 13 in the cross-machine direction ($D_c$), and at the leading edge 15 and the trailing edge 16 in the machine direction ($D_m$). Additionally, the thin film layer(s) 14 can be present (e.g., as a defined layer or as thin film material) on the side edges 12, 13 and/or on the leading edge 15 and/or the trailing edge 16 of the substrate 10. Thin film layers may also be present on the opposite surface of the substrate 10 in certain embodiments.

The apparatus 100 includes a transport mechanism 100 configured to move the substrate 10 in a machine direction $D_m$ past a first laser source 102 and a second laser source 104 such that the first side edge 12 of the substrate 10 directly faces the first laser source 102 and the second side edge 13 of the substrate 10 directly faces the second laser source 104. The first laser source 102 is configured to focus (e.g., via a lens) a first laser beam 106 onto the first side edge 12, and the second laser source 104 is configured to focus (e.g., via a lens) a second laser beam 108 onto the second side edge 13.

Since the first and second laser beams 106, 108 are directly focused onto the side edges 12, 13, respectively, the laser beams 106, 108 do not have to travel through the substrate 10 in order to remove the thin film material 14. As such, the likelihood of interfering with the thin film layers 14 on the facing surface 11 of the substrate can be reduced.

As shown, the first and second laser sources 102, 104 are oriented such that the first and second laser beams 106, 108 are focused in the cross-machine direction $D_c$ that is perpendicular to the machine direction $D_m$.

In one embodiment, the first laser beam 106 and the second laser beam 108 can be scanned in the z-direction $D_z$ onto the first side edge 12 and the second side edge 13, respectively, such that the thin film is removed in the entire thickness defined in the z-direction $D_z$. Additionally or alternatively, the first laser beam 106 and the second laser beam 108 can be scanned in the machine direction $D_m$ onto the first side edge 12 and the second side edge 13, respectively, such that the thin film 14 is removed from the entire first and second side edges 12, 13 while the substrate 10 is transported in the machine direction $D_m$.

For example, a first scanning mechanism 103 and a second scanning mechanism 105 can be attached to the first and second laser sources 102, 104, respectively, in order to scan the laser beams 106, 108 in the z-direction $D_z$ and/or the machine direction $D_m$. The first scanning mechanism 103 and the second scanning mechanism 105 can be connected to a computer (not shown) programmed to automatically control the first and second laser beams 106, 108.

In the embodiment shown, the first laser source 102 and the second laser source 104 are positioned directly across from each other in the cross-machine direction $D_c$ such that the substrate 10 passes therebetween. Thus, the first side edge 12 and the second side edge 13 can be simultaneously exposed to the first laser beam 106 and the second laser beam 108, respectively.

The first and second laser beams 106, 108 can have any suitable frequency desired, though selection of the frequency can depend on the type of thin film material 14 present on the side edges 12, 13 of the substrate. For example, the first and second laser sources 102, 104 can be configured to provide the first and second laser beams 106, 108 at a frequency of about 980 nm to about 1070 nm. Such a frequency can be particularly useful for removing cadmium telluride from the side edges 12, 13 of the substrate 10.

In one particular embodiment, the first and/or second laser beams 106, 108 can be pulsed to have a pulse length of about 5 nanoseconds (ns) to about 200 ns (e.g., about 5 ns to about 60 ns). Additionally, the first and/or second laser source 102, 104 can have a power of about 400 W to about 1000 W.

In one embodiment, the substrate 10 can be rotated 90° and then re-run through the apparatus 100 (or through another apparatus 100 downstream) in order to remove any thin film material 14 from the leading edge 15 and trailing edge 16. Thus, all four edges 12, 13, 15, 16 can be cleaned for further processing.

In yet another embodiment, a single laser source 102 may be used to clean all four edges 12, 13, 15, 16. In such an embodiment, the substrate 10 run through the apparatus 100 to clean edge 12, and then can be rotated 90° and then re-run through the apparatus 100 (or through another apparatus 100 downstream) in order to remove any thin film material 14 from edge 13. This rotation and re-run through the apparatus 100 (or through another apparatus 100 downstream) can then be repeated for the leading edge 15 and trailing edge 16. Thus, all four edges 12, 13, 15, 16 can be cleaned for further processing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A method of cleaning a side edge of a thin film photovoltaic substrate, wherein the substrate defines a face surface terminating at a first side edge, and wherein a thin film is present on the face surface and the first side edge of the substrate, the method comprising:
    transporting the substrate in a machine direction to move the substrate past a first laser source; and,
    focusing a first laser beam generated by the first laser source onto the first side edge of the substrate such that the first laser beam removes the thin film present on the first side edge of the substrate, while the thin film layer on the face surface of the substrate is substantially unaffected by the first laser beam focused onto the first side edge of the substrate.

2. The method as in claim 1, wherein the first laser beam is oriented in a cross-machine direction that is perpendicular to the machine direction.

3. The method as in claim 1, wherein the first laser beam is focused directly onto the side edge of the substrate.

4. The method as in claim 1, further comprising:
    scanning the first laser beam in a z-direction onto the first side edge of the substrate such that the thin film is removed in the entire thickness first side edge.

5. The method as in claim 1, further comprising:
    scanning the first laser beam in the machine direction onto the first side edge of the substrate such that the thin film is removed from the entire first side edge while the substrate is transported in the machine direction.

6. The method as in claim 1, wherein the laser beam has at least one of the following properties:
    a frequency of about 980 nm to about 1070 nm;
    pulsed to have a pulse length of about 5 ns to about 200 ns; and
    a power of about 400 W to about 1000 W.

7. The method as in claim 6, wherein the thin film comprises cadmium telluride.

8. The method as in claim 1, wherein the substrate defines a quadrilateral having four outside edges, a leading edge, a trailing edge, and a second side edge, the method further comprising:
    transporting the substrate in a machine direction to move the substrate past a second laser source; and,
    focusing a second laser beam generated by the second laser source onto the second side edge of the substrate such that the second laser beam removes the thin film present on the second side edge of the substrate.

9. The method as in claim 8, wherein the substrate moves past the first laser source and second laser source simultaneously.

10. The method as in claim 8, further comprising:
    rotating the substrate 90°; and,
    thereafter, transporting the substrate in the machine direction past the first laser source and second laser source such that any thin film material on the leading edge and the trailing edge is removed.

11. An apparatus for cleaning a first side edge and a second side edge of a thin film photovoltaic substrate, the apparatus comprising:
    a first laser source configured to focus a first laser beam;
    a second laser source configured to focus a second laser beam; and,
    a transport mechanism configured to move the substrate in a machine direction past the first laser source and the second laser source such that the first side edge of the substrate directly faces the first laser source and the second side edge of the substrate directly faces the second laser source;
    wherein the first laser beam is connected to a first scanning mechanism configured such that the first laser beam is capable of scanning in the machine direction onto the first side edge of the substrate, and wherein the second laser beam is connected to a second scanning mechanism configured such that the second laser beam is capable of scanning in the machine direction onto the second side edge of the substrate.

12. A method of cleaning a side edge of a thin film photovoltaic substrate, wherein the substrate defines a face surface terminating at a first side edge, and wherein a thin film is present on the face surface and the first side edge of the substrate, the method comprising:
    transporting the substrate in a machine direction to move the substrate past a first laser source;
    focusing a first laser beam generated by the first laser source onto the first side edge of the substrate such that the first laser beam removes the thin film present on the first side edge of the substrate; and
    scanning the first laser beam in a z-direction onto the first side edge of the substrate such that the thin film is removed in the entire thickness first side edge.

13. The method as in claim 12, wherein the laser beam has at least one of the following properties:
    a frequency of about 980 nm to about 1070 nm;
    pulsed to have a pulse length of about 5 ns to about 200 ns; and
    a power of about 400 W to about 1000 W.

14. An apparatus for cleaning a first side edge and a second side edge of a thin film photovoltaic substrate, the apparatus comprising:
    a first laser source configured to focus a first laser beam;
    a second laser source configured to focus a second laser beam; and,
    a transport mechanism configured to move the substrate linearly in a machine direction past the first laser source and the second laser source such that the first side edge of the substrate directly faces the first laser source and the second side edge of the substrate directly faces the second laser source.

15. The apparatus as in claim 14, wherein the first laser beam is oriented in a cross-machine direction that is perpendicular to the machine direction, and wherein the second laser beam is oriented in the cross-machine direction.

16. The apparatus as in claim 14, wherein the first laser beam is connected to a first scanning mechanism configured such that the first laser beam is capable of scanning in a z-direction onto the first side edge of the substrate, and wherein the second laser beam is connected to a second scanning mechanism configured such that the second laser beam is capable of scanning in the z-direction onto the second side edge of the substrate.

17. The apparatus as in claim 14, wherein the first laser beam is connected to a first scanning mechanism configured such that the first laser beam is capable of scanning in the machine direction onto the first side edge of the substrate, and wherein the second laser beam is connected to a second scanning mechanism configured such that the second laser beam is capable of scanning in the machine direction onto the second side edge of the substrate.

18. The apparatus as in claim 14, wherein the first laser source and the second laser source are positioned across from each other in a cross-machine direction such that the substrate passes therebetween.

19. The apparatus as in claim 14, wherein the first laser beam has a frequency of about 980 nm to about 1070 nm, and wherein the second laser beam has a frequency of about 980 nm to about 1070 nm.

20. The apparatus as in claim 19, wherein the first laser source has a power of about 400 W to about 1000 W, and wherein the second laser source has a power of about 400 W to about 1000 W.

* * * * *